(12) United States Patent
Tindall et al.

(10) Patent No.: US 7,060,523 B2
(45) Date of Patent: Jun. 13, 2006

(54) LITHIUM-DRIFTED SILICON DETECTOR WITH SEGMENTED CONTACTS

(75) Inventors: Craig S. Tindall, San Ramon, CA (US); Paul N. Luke, Castro Valley, CA (US)

(73) Assignee: The Regents of the University of California, Oakland, CA (US)

( * ) Notice: Subject to any disclaimer, the term of this patent is extended or adjusted under 35 U.S.C. 154(b) by 115 days.

(21) Appl. No.: 10/845,600

(22) Filed: May 12, 2004

(65) Prior Publication Data

US 2005/0001213 A1   Jan. 6, 2005

Related U.S. Application Data

(60) Provisional application No. 60/470,087, filed on May 12, 2003, provisional application No. 60/547,926, filed on Feb. 25, 2004.

(51) Int. Cl.
  *H01L 21/00* (2006.01)
(52) U.S. Cl. .......................... 438/57; 257/428; 257/429
(58) Field of Classification Search ..................... None
  See application file for complete search history.

(56) References Cited

U.S. PATENT DOCUMENTS 5,773,829 A   6/1998   Iwanczyk et al.
6,486,476 B1  11/2002  Ochiai et al.

2002/0134939 A1 *  9/2002   Giedd ..................... 250/338.1

OTHER PUBLICATIONS

J.T. Walton et al., "Amorphous Silicon/Crystalline Silicon Heterojunctions in Nuclear Radiation Detector Fabrication", 1998 MRS Final Version, LBNL-40972, 6 pages.

Tindall, C.S., et al.; Large-Area Si(Li) Orthogonal-Strip Detectors, IEEE Transactions on Nuclear Science, Jun. 2004, vol. 51, No. 3, pp. 1140-1143.

Riepe, G., et al.; Thick Silicon Strip Detectors Nuclear Instruments and Methods in Physics Research, 1984, vol. 226, pp. 103-106.

(Continued)

*Primary Examiner*—Tu-Tu Ho
(74) *Attorney, Agent, or Firm*—R'Sue P. Caron; Lawrence Berkeley National Laboratory

(57) ABSTRACT

A method and apparatus for creating both segmented and unsegmented radiation detectors which can operate at room temperature. The devices include a metal contact layer, and an n-type blocking contact formed from a thin layer of amorphous semiconductor. In one embodiment the material beneath the n-type contact is n-type material, such as lithium compensated silicon that forms the active region of the device. The active layer has been compensated to a degree at which the device may be fully depleted at low bias voltages. A p-type blocking contact layer, or a p-type donor material can be formed beneath a second metal contact layer to complete the device structure. When the contacts to the device are segmented, the device is capable of position sensitive detection and spectroscopy of ionizing radiation, such as photons, electrons, and ions.

7 Claims, 8 Drawing Sheets

OTHER PUBLICATIONS

Protic, D., et al.; Development of Transmission Si(Li) Detectors, IEEE Transactions On Nuclear Science, Aug. 2003, vol. 50, No. 4, pp. 1008-1012.

Protic, D., et al.; Development of Double-Sided Microstructured Si(Li) Detectors, Aug. 2002, vol. 49, No. 4, pp. 1993-1998.

Walton, J.T., et al.; Amorphous Silicon/Crystalline Silicon Heterojunctions in Nuclear Radiation Detector Fabrication.

Tindall, C., et al.; Evaluation of Si(Li) Detectors for Use in Compton Telescopes, Symposium on Radiation Measurements and Applications, May 21-23, 2002, LBNL-50234, pp. 1-15.

Hau, I.D., et al.; New Contact Development for Si9Li) Orthogonal-Strip Dectectors, Symposium on Radiation Measurements and Applications, May 2002, LBNL-50350, pp. 1-5.

* cited by examiner

LITHIUM-DRIFTED SILICON DETECTOR WITH SEGMENTED CONTACTS

CROSS-REFERENCE TO RELATED APPLICATIONS

This application claims priority from U.S. provisional application Ser. No. 60/470,087 filed on May 12, 2003, incorporated herein by reference in its entirety. This application also claims priority from U.S. provisional application Ser. No. 60/547,926 filed on Feb. 25, 2004, incorporated herein by reference in its entirety.

STATEMENT REGARDING FEDERALLY SPONSORED RESEARCH OR DEVELOPMENT

This invention was made with U.S. Government support under Contract Number DE-AC03-76SF00098 between the U.S. Department of Energy and The Regents of the University of California for the management and operation of the Lawrence Berkeley National Laboratory. The U.S. Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

A portion of the material in this patent document is also subject to protection under the maskwork registration laws of the United States and of other countries. The owner of the maskwork rights has no objection to the facsimile reproduction by anyone of the patent document or the patent disclosure, as it appears in the United States Patent and Trademark Office publicly available file or records, but otherwise reserves all maskwork rights whatsoever. The maskwork owner does not hereby waive any of its rights to have this patent document maintained in secrecy, including without limitation its rights pursuant to 37 C.F.R. § 1.14.

BACKGROUND OF THE INVENTION

1. Field of the Invention

The present invention pertains generally to devices, methods and systems used in radiation detection, and more particularly to position sensitive lithium-drifted detectors, particularly those utilized near room temperature.

2. Description of Related Art

Lithium-drifted Germanium (Ge(Li)) detectors were developed and successfully used for gamma-ray spectroscopy in the early 1960s. The excellent energy resolution and good efficiency achieved by these detectors provided experimenters with unprecedented capabilities in gamma-ray measurements, and this has revolutionized the field of gamma-ray spectroscopy. In the 1970s, high-purity Ge became available and rapidly replaced Ge(Li). With high-purity Ge, the detectors can be made stable at room temperature, and thus the fabrication of detectors can be carried out without the severe time constraints that existed when working with Ge(Li) detectors. This opened up new possibilities in terms of detector processing, and allowed the production of more diverse types of detectors and multi-detector systems.

In the ensuing decades, there have been continuing advances in semiconductor gamma-ray detector technology. Ge detectors continue to increase in size and complexity. More recently, detectors based on other materials, such as Si and CdZnTe, have also been actively developed for gamma-ray detection. Advances in the technology of semiconductor gamma-ray detectors are the results of contributions from many groups.

U.S. Pat. No. 6,486,476, incorporated herein by reference and attached hereto, discloses a semiconductor radiation detector and a method for fabricating such detector. U.S. Pat. No. 5,773,829, also incorporated herein by reference and attached hereto, discloses a scintillator-based radiation detector, which is somewhat representative of generic radiation detection.

FIG. 1 illustrates a lithium drifted silicon detector fabricated conventionally. The detector consists of a p-type silicon substrate having an n-type lithium contact on the top surface, and a p-type gold surface barrier contact on the bottom surface. The figure illustrates the "deep groove" configuration, but such a detector may be fabricated in the top hat configuration and with straight sides as well.

The method for fabricating a segmented lithium-drifted silicon detector using conventional fabrication processes comprises the steps of: (a) providing a p-type silicon substrate having a top and bottom surface; (b) forming an n-type contact by depositing a lithium layer on the top surface and diffusing it into the substrate by heating the substrate; (c) forming a p-type contact by chemically etching the bottom surface and then evaporating gold metal on that surface to form a surface barrier, (d) compensating the p-type substrate by simultaneously applying heat and an electric field between the n-type contact on the top surface and the p-type contact on the bottom surface for a sufficient amount of time to cause the lithium to drift into the substrate and compensate the p-type impurities to a residual concentration of less than or equal to $10^{10}$ cm$^{-3}$ within the substrate, and (e) segmenting the lithium contact (n-type) either by chemical etching or mechanical removal (i.e. sawing) to remove material in order to isolate the conductive segments from one another.

In the conventional process, since the diffused lithium contact has a thickness of between twenty and several hundred microns, a significant amount of material must be removed. Although this is a viable process, it suffers from device pitch limitations (number of segments per mm). In the case of the gold surface barrier (p-type), the adhesion of the gold to the silicon surface is also very poor, making electrical connection to the substrate difficult and rendering the contact prone to failure.

Therefore, it will be appreciated that new fabrication methods are needed to simplify the fabrication process of radiation detectors and that new device structures are needed which lend themselves to new fabrication methods. The present invention fulfills these needs as well as others and overcomes limitations of prior radiation detection devices.

BRIEF SUMMARY OF THE INVENTION

It is the general objective of this invention to provide radiation detectors which are readily fabricated and which may be utilized at room temperatures. Taught within the present invention are several detector embodiments including those fabricated from Si (i.e. Si(Li)), Ge, and CdZnTe.

One aspect of the invention provides a method for fabricating unsegmented as well as segmented semiconductor radiation detectors, such as embodied by lithium-drifted silicon detectors.

In one embodiment of the invention, the apparatus for detecting radiation comprises: (a) a substrate of crystalline semiconductor material having a p-n junction; (b) means for passivating the substrate of crystalline semiconductor material without adversely affecting the ability to form contacts on p and n junction portions of the crystalline semiconductor material; (c) a first and second metallic contact formed over the passivating means on said p and n junction portions of the crystalline semiconductor material.

To create a position sensitive radiation detector, the first and/or second metallic contact is segmented forming a pattern of separate contacts on the exterior of the substrate. Embodiments are described in which the semiconductor material comprises silicon (Si) or germanium (Ge). The n junction on the substrate is formed by introducing lithium (Li) into the semiconductor material, while the p region of the junction is formed by introducing a dopant selected from the group of dopants consisting essentially of boron (B), aluminum (Al), gallium (Ga), indium (In) and thallium (Tl) into the semiconductor material. One embodiment of the means for passivating the section of crystalline semiconductor comprises depositing a thin film of amorphous semiconductor material upon at least portions of said section of crystalline semiconductor material to create a blocking junction, preferably over the n-type region containing the lithium. By way of example, the n-type region can be formed by depositing lithium onto the substrate followed by a compensation process under an applied voltage and heating, whereafter the lithium layer can be removed prior to depositing the amorphous semiconductor and contact metallization.

In another embodiment, an apparatus for detecting radiation according to the invention comprises: (a) a substrate of crystalline semiconductor material; (b) a first contact area on a portion of the crystalline semiconductor material configured as an n-type region (i.e. lithium diffused); (c) a second contact area on a portion of the crystalline semiconductor material configured as a p-type region (i.e. p-type substrate, p-doping, and/or p-layer); (d) a thin film of amorphous semiconductor material disposed upon at least portions of the crystalline semiconductor material (i.e. surrounding substrate, over n-region and/or over p-region) to create a blocking junction; and (e) a first metallic contact coupled to the n-type region and a second metallic contact coupled to the p-type region, wherein the first and/or the second metallic contacts are coupled to the substrate through the amorphous semiconductor material. In one form of embodiment the substrate is a p-type material upon which an n-type region is formed, although the p-n junction may be created by any convenient means.

The metallization to which the electrical connections for the detector are to be coupled can be formed as single conductive elements, or segmented into separate conductive regions to allow radiation sensing based on position across the substrate.

In a further embodiment, a segmented lithium-drifted silicon detector according to the invention comprises: (a) a compensated p-type silicon substrate having a n-type lithium layer on a first surface (top); (b) an amorphous silicon layer formed over the first surface and configured to receive contact metallization; and (c) an annealed p-type dopant (i.e. boron) ion implanted layer on the second surface (bottom) and configured to receive contact metallization. A first and second conductive layer can be deposited over the first and second surfaces of the substrate which are simultaneously or subsequently patterned with first and second pattern, such as providing segmentation of the contacts.

In still another embodiment, a segmented lithium-drifted silicon detector according to the present invention comprises: (a) a lithium-drift compensated silicon wafer having a lithium region proximal a first surface; (b) a p-type contact formed on a second surface of the wafer by ion implantation followed by annealing for a sufficient time and temperature to form a diode; (c) an amorphous silicon layer deposited over the first surface of the wafer; and (d) at least one metallic contact deposited over the n-type and p-type contacts. In one embodiment the silicon wafer is configured with one or more grooves or troughs defining an active detector region within the wafer for controlling detector surface leakage currents.

According to another embodiment of the invention, a method of fabricating radiation detectors comprises the steps of: (a) providing a p-type silicon crystalline semiconductor substrate; (b) forming a doped p-type layer on the bottom surface of the substrate; (c) forming a doped n-type material on the top surface of the substrate to form an n-type layer; (d) compensating the p-type substrate to a desired atomic concentration within the substrate; (e) removing the n-type (i.e. lithium) material layer from the top surface; and (f) depositing an amorphous semiconductor (i.e. a-si) layer on the top surface of the substrate in preparation for establishing electrical contacts thereon. This process results in an unsegmented lithium drifted silicon detector. It should be appreciated that a patterned conductive layer, such as arranged in strips, pixels, or other multi-segment arrangement can be deposited, or otherwise formed, on the substrate to create segmented contacts wherein both the intensity and location of gamma activity can be registered by the radiation detection device.

According to one embodiment of the invention the p-type contact is formed by doping, such as according to an ion implantation process of a suitable p-type dopant, and moderate temperature annealing. The p-type dopant is preferably boron, but those skilled in the art will appreciate that other elements that act as acceptors, principally from the Group III elements of the periodic table of the elements, such as B, Al, Ga, In, or Tl alone or in combination.

An aspect of the invention is the creation of semiconductor radiation detectors.

Another aspect of the invention is the creation of radiation detectors that can be utilized at, or near, room temperature.

Another aspect of the invention is the creation of radiation detectors that provide for positional sensing of detected radiation.

Another aspect of the invention is the passivation of the substrate, or portions thereof, with a thin layer of amorphous semiconductor beneath one or both metallized contacts and between the contacts.

Another aspect of the invention is the creation of radiation detectors having a blocking junction beneath one or both electrical contacts.

Another aspect of the invention is the creation of radiation detectors to which electrical contacts can be securely bonded, such as by wire bonding.

Another aspect of the invention is the creation of radiation detectors that exhibit low leakage current thereby increasing the achievable signal-to-noise ratio.

A still further aspect of the invention is the creation of radiation detectors that can be utilized at lower bias voltage levels.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1:
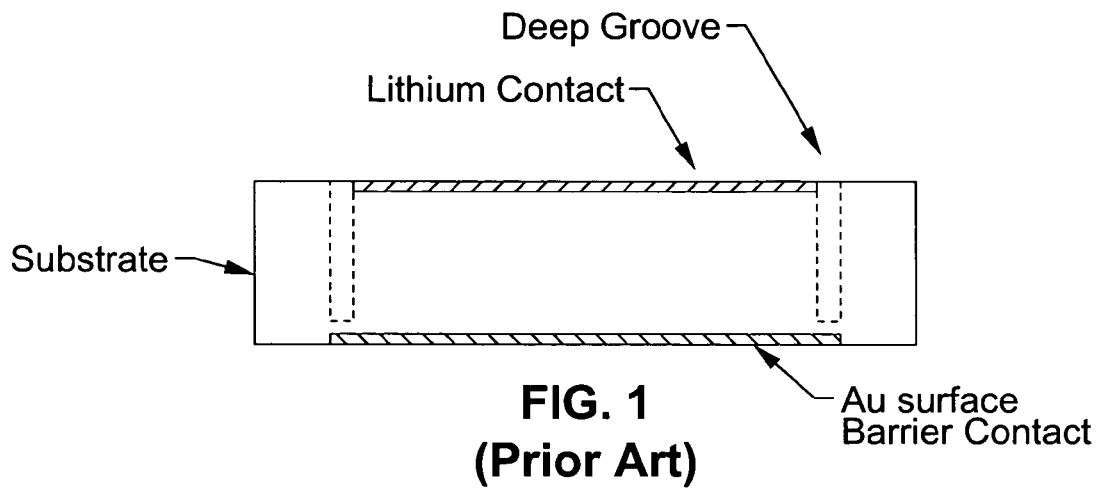
FIG. 1 is a cross-sectional view of an unsegmented Si(Li) detector with an isolation groove fabricated conventionally.

Referring more specifically to the drawings, for illustrative purposes the present invention is embodied in the apparatus generally shown in FIG. 2 through FIG. 11B. It will be appreciated that the apparatus may vary as to configuration and as to details of the parts, and that the method may vary as to the specific steps and sequence, without departing from the basic concepts as disclosed herein.

Embodiments of semiconductor radiation detectors are taught within the present invention. Although other semiconductor materials may be utilized, the invention describes embodiments utilizing silicon, germanium and CdZnTe.

Lithium-Drifted Silicon Compensation

Lithium-drifted silicon (Si(Li)) is a charge-compensated, or more simply compensated, material with reduced net ionic charge in the bulk crystalline Si material. This aspect is particularly important for use in radiation detectors having thicknesses ranging from 1–10 mm or more. Lithium drifting is more accurately stated as thermoelectrically induced lithium ion migration through the bulk (crystalline) Si material so that remaining negative boron (B) ions (or B$^-$) in the initial bulk Si are paired with corresponding positively charged Li$^+$ ions to reduce the unpaired B$^-$ ionic concentration to a level at or below approximately $10^{10}$ cm$^{-3}$; such material is termed compensated. It will be appreciated that other acceptors may be utilized in place of boron as the p-type dopant material selected from the group of dopant materials consisting essentially of boron (B), aluminum (Al), gallium (Ga), indium (In) and thallium (Tl) into the semiconductor material over which a metallized electrical contact material is overlayed.

In one embodiment, compensation is provided by deposited a B layer on a bottom surface of a p-type Si crystalline substrate, such as through ion implantation followed by a moderate temperature anneal (the Si bulk material is p-type by virtue of residual B doping). The use of "moderate" temperature anneal in this case being performed at less than or equal to 550° C. Such "moderate" anneal is performed at lower temperatures than traditional complementary metal oxide silicon (CMOS) annealing, which is performed at around 900° C. Lithium is then deposited on a top surface of the bulk material, preferably in a sufficient thickness to provide both an electrical contact and a reservoir for the Li drifting process to compensate the p-type bulk substrate material.

Compensation has several attributes, among which are reduced bias voltages leading to simplified detector electronics by virtue of working at lower voltages (e.g. 500 volts bias for a 5 mm thick detector, versus about 5 kV or more for an uncompensated detector), and reduced leakage currents due to reduces bias voltage levels. To achieve compensation, a suitable drifting voltage is applied between the n-type (i.e. Li diffused) contact and the p-type (i.e. Au surface barrier) contact on opposite sides of the Si bulk material, which in combination with sufficient heating of the bulk material substrate, initiates thermoelectrically induced migration of the Li ions throughout the bulk crystalline material.

Typically, such drifting is used to reduce the net uncompensated B$^-$ charge to a concentration at or below $10^{10}$ cm$^{-3}$. The amount of time required to achieve complete compensation of the material depends on its thickness as well as the bias voltage and temperature at which the lithium drifting process is carried out. For example, at a set thickness of 5 mm, 300–500 kV-hours compensation is normally required at 110° C. depending on the material properties. Theoretically, the uncompensated charge state could be reduced to maximum values on the order of $10^9$ cm–3, $10^8$ cm–3, $10^7$ cm–3, $10^6$ cm–3 or even lower. Compensation appears to be a somewhat nonlinear time-temperature-voltage bias phenomenon, but with somewhat linear time-voltage characteristics at a given temperature.

According to one embodiment of the invention, the residual reservoir of Li which had earlier functioned as an electrical bias electrode is removed after compensation. The Li removal can be accomplished through a variety of chemical, laser, mechanical, or other methods, singly or in combination. The preferred method of removal is mechanical grinding followed by an additional step of chemically etching the surface for an additional 75 microns. In one embodiment the topmost 10–600 microns, more preferably 100–500 microns, and most preferably 200–400 microns of the top surface of the bulk silicon substrate is removed to ensure that all the surface Li layer, and any extremely high Li-concentration substrate is removed. After such Li layer removal, traditional photolithographic techniques may be used to continue fabrication of a Si(Li) radiation detector. At this point, the remaining bulk Si substrate is known as compensated, lithium-drifted, or abbreviated Si(Li).

Described within the invention are contact segmentation techniques which simplify the fabrication of multi-segment detectors, and can potentially increase the yield and reduce the cost of producing silicon detectors. These contacts make use of an amorphous-Si (a-Si) thin film over Si (or other forms of amorphous semiconductor over a crystalline semiconductor) to create an electrically blocking junction between the amorphous-Si and the bulk Si crystal. The blocking junction permits the application of bias voltage to fully deplete the detector while maintaining a low leakage current.

Lithium-drifted silicon (Si(Li)) radiation detectors have use in a wide variety of scientific, medical, industrial, astronomical, and military applications. They can also be utilized for detecting charged particles, x-rays, gamma-rays and infrared radiation. Traditionally, Si(Li) detectors have not seen general use as gamma-ray detectors because silicon is relatively transparent to gamma-ray photons, thus making them relatively insensitive to such photon energies. This lack of sensitivity can be overcome within the present invention by increasing the thickness of the detector substrate. The efficiency of silicon detectors in detecting penetrating radiation such as high energy x-rays and gamma-rays is enhanced by using a large detector thickness, such as within the range of 1–10 mm, or thicker within the present invention. This level of thickness is far beyond that utilized within detectors commonly produced using high-purity silicon material. Greater purity is obtainable with thinner material wherein typical thicknesses are on the order of 2 mm or less.

One application for the present invention related to Compton telescope designs, which traditionally require the use of a high Z (atomic number) material (such as germanium), which must be cooled to liquid nitrogen temperature. However, in recent years a new concept has been conceived that makes it advantageous to construct a Compton gamma-ray telescope using Si(Li) detectors. Si(Li) detectors dramatically reduce the need for cooling of detector arrays. However, as in traditional Compton telescope schemes, excellent position and energy resolution are required of the detectors in order to accurately determine the incoming energies and directions of gamma-rays (γ-rays).

To determine the incoming direction of gamma-rays (γ-rays) a grid or array of gamma-rays pixels are created. By determining the particular pixel location of a particular gamma-ray as it passes through sequentially stacked planes of detector pixels, it is possible to determine the direction traveled by a particular gamma-ray by retracing the pixels excited during transit.

In order to fabricate such pixel arrays a process is described herein for making Si(Li) detectors having segmented contacts. Segmented contacts are a technology that enables the building of larger, higher resolution (for spatial sensitivity), and thus more sensitive detector, such as for Compton telescopes, that are of use for gamma-ray astronomy, national security and nuclear non-proliferation applications. Such detectors may also find uses in other areas such as x-ray imaging, and charged particle detection.

Si(Li) strip detectors with a pitch on the order of 1 mm, or even up to 10 mm or more, are required in order to construct a high-performance gamma-ray or x-ray Compton telescope. In order make these strips, improved p-type and n-type contacts are required. Traditional Si(Li) detectors are fabricated with a diffused lithium layer as the n-type contact and a gold surface barrier as the p-type contact. In such devices, the lithium contact is too thick to easily be divided into strips or pixels.

In an embodiment of this invention, the initial lithium contact (used for compensation) has been removed, and subsequently replaced by a thin amorphous semiconductor layer, such as amorphous silicon (a-Si). The a-Si contact can be segmented into strips (or pixels, etc.) simply by depositing metal strips (pixels) over the a-Si. In the case of the previously used gold (Au) surface barrier, the adhesion of the gold to the silicon is very poor, creating a very fragile contact where usable wire bonding is either unlikely or not possible. Therefore, in an embodiment of the present invention this fragile contact is replaced with a more robust implanted contact. The resulting contact is thin, and may easily be divided into strips by subsequent chemical etching.

Lithium-Drifted Silicon Detectors

The silicon detectors described in this invention disclosure may be used in a number of applications, such as in constructing large volume Compton telescopes at a lower cost than would be possible using germanium detectors. It should be appreciated that the sensitivity of a Compton telescope is directly related to its size, with larger instruments being more sensitive. These telescopes are used to determine the gamma-ray spectrum and to obtain images of radioactive sources. The silicon detectors may also be used for x-ray imaging and spectroscopy, charged-particle detection, and infrared detection. Potential applications include nuclear non-proliferation, homeland security, astronomy, medical imaging, scientific research, and industrial sensing.

Detector Segmentation

An aspect of the invention provides a lithium-drifted silicon diode with novel contacts that are easily divided into strips or pixels. The diode includes a segmented layer of doped p-type silicon covered with metal that forms the p-type contact element on a bulk region, or substrate, of p-type silicon which has been compensated using the lithium drifting technique. On the opposing side of the bulk region or substrate a layer of amorphous semiconductor (i.e. amorphous silicon) that acts as the n-type contact.

The electrical segmentation of the n-type contact into multiple elements can be accomplished by segmenting the metal layer that is deposited over the amorphous silicon. In one embodiment the p-type contact is segmented by removing metal on the p-type contact side and segmented metal layers are deposited over the implanted silicon. The implanted silicon material in between the metal layers can be etched away, such as by using a hydrofluoric/nitric acid mixture or other chemical or physical means to remove the implanted silicon in between the strips or pixels. The separated segments provide position sensitivity as gamma-rays interaction can be detected in each individual segment of the detector. A deep groove can be formed about the device area (i.e. strips or pixels) which isolates the p-type strips from each other, thus reducing device leakage currents, and improving sensitivity and signal to noise ratio of the device as coupled to charge amplification circuitry.

In addition to the novel contact technology, a novel surface treatment process is applied to the silicon surface between the p-type contact elements in order to obtain improved electrical isolation, low leakage currents, and hence improved signal-to-noise ratios of the detector. Segmented Si(Li) detectors are desired in applications requiring imaging of radiation. Segmentation allows the positions of radiation interaction inside the detector to be determined. This, when combined with certain masking and/or reconstruction techniques, produces an image of radiation sources.

The surface is then preferably treated using a potassium hydroxide and water mixture to condition and stabilize the surface so that good electrical isolation between the strips and low leakage currents can be obtained which improve the signal-to-noise ratio.

Embodiments of Si(Li) Detector Segments

FIG. 2 through FIG. 5 depict embodiments of the Si(Li) radiation detector device which can be implemented according to a number of different geometries.

Figure 2:
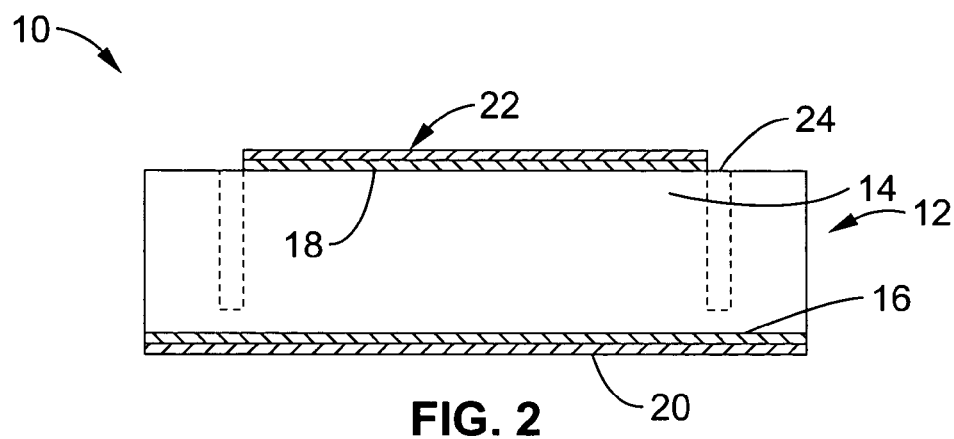
FIG. 2 is cross-sectional view of an unsegmented Si(Li) detector fabricated according to an embodiment of the present invention and shown with an isolation groove surrounding the device area.

FIG. 2 illustrates an embodiment 10 of a lithium-drifted Si(Li) detector having a substrate 12 having lithium diffused into the top portion 14 of the substrate and boron implanted layer 16 on the bottom of substrate 12. An amorphous semiconductor layer 18, such as a-Si, is deposited over topside 14 of substrate 12. metallic contacts 20, 22 are created on top and bottom to provide electrical connectivity to the detector device. The metallic contacts are shown unsegmented in this figure. A deep groove 24 preferably surrounds the device area.

It should be appreciated that the embodiment of this figure provide an unsegmented Si(Li) detector which utilizes a new form of contact that is more robust and thin, wherein it can be more readily segmented and electrically interconnected using traditional ultrasonic or thermosonic wirebonding techniques.

Figure 3:
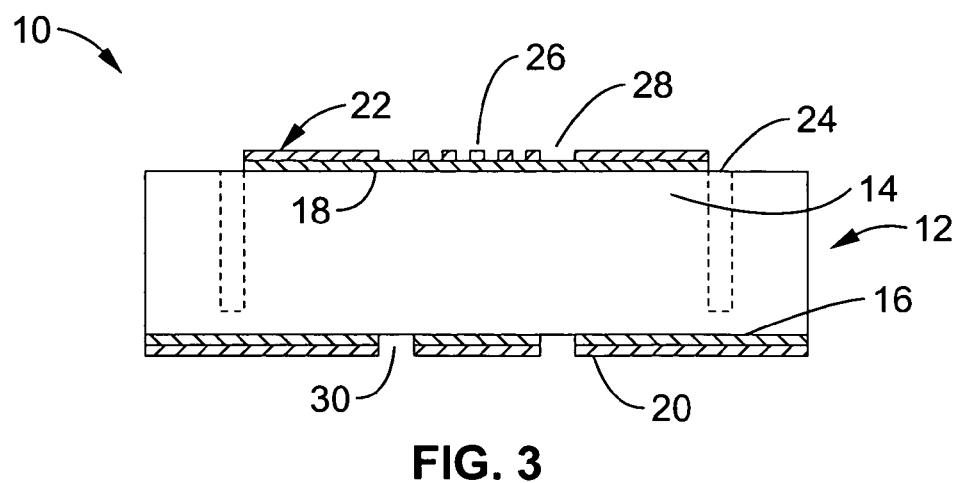
FIG. 3 is a cross-sectional view of a segmented Si(Li) detector fabricated according to an embodiment of the present invention and shown with segmented p and n contacts.

FIG. 3 illustrates an embodiment 10 of a lithium-drifted Si(Li) detector which is deeply grooved about the perimeter of the device and formed with segmented contacts. It should be appreciated that the device "island" can be formed in any desired geometric shape, such as circular, square, rectangular, triangular, and so forth without departing from the teachings of the present invention. At least a portion of upper contact 22 is segmented with contacts 26 and contact gaps 28. Underside contact 20 is similarly segmented with contact gaps 30 which preferably extend through both the metallic contact and the boron implanted layer.

Figure 4:
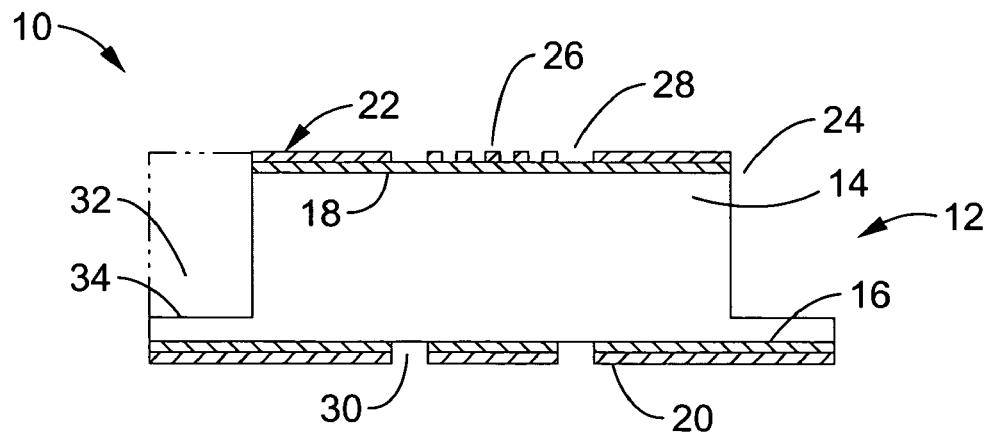
FIG. 4 is a cross-sectional view of a segmented Si(Li) detector fabricated according to an embodiment of the present invention and shown with inactive material removed surrounding a circular perimeter of the device yielding a "top hat" configuration.

FIG. 4 illustrates an embodiment 10 of a lithium-drifted Si(Li) detector in which the deep groove has been extended into a cutaway portion 32 leaving a thin layer 34 of substrate 12 extending about the circular base of the active area this forming what can be referred to as a "top hat" configuration. In this embodiment the inactive material is removed except for a lip near the p-type contact therein forming a true "top hat" device.

Figure 5:
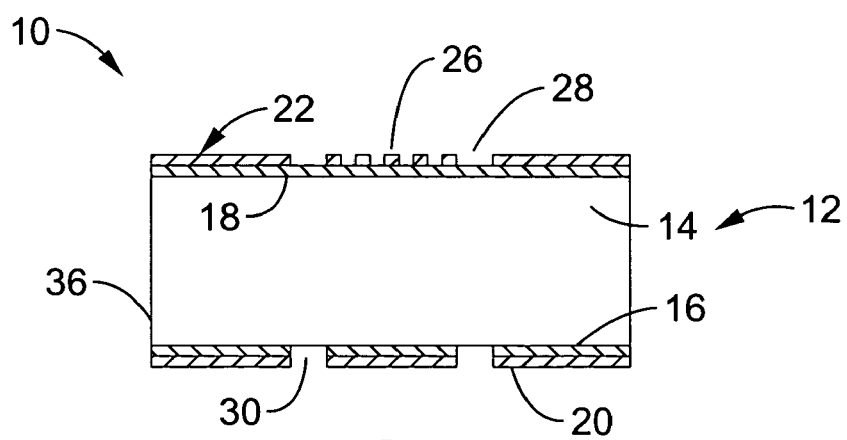
FIG. 5 is a cross-sectional view of a segmented Si(Li) detector fabricated according to an embodiment of the present invention, shown with isolated straight sides.

FIG. 5 illustrates an embodiment 10 of a lithium-drifted Si(Li) detector in which the groove is extended through to the opposing side, thereby forming a separate detector device with straight sides 36. It should be noted that devices separated from the substrate may be assembled into arrays using any available process, including conventional pick and place methods, self-assembly techniques (i.e. floating techniques), and so forth. It is contemplated that the above embodiments may be modified to facilitate one or more assembly techniques.

The above embodiments of the invention generally describe a lithium-drifted silicon diode with novel contacts that are easily divided into strips or pixels. The following describes the device structure from the bottom up. The underside of silicon diode 10 comprises a layer of metal 20 that forms the p-type contact elements, and may be segmented having contact gaps 30. The contact metallization is adjacent to a segmented layer of heavily doped p-type silicon 16 (i.e. boron doped). The p-type contact layer is adjacent to a semiconducting substrate 12, or layer, of lightly doped p-type silicon, which has been compensated, such as using the lithium drifting technique. Next follows a layer of amorphous semiconductor 18 (i.e. amorphous silicon) that passivates the n-type contact region. A metal layer 22 overlays amorphous semiconductor layer 18. The metallic contact can be segmented into multiple electrical contact elements 26, such as by depositing the metal in a segmented pattern or depositing an unsegmented metal contact followed by removing portions of the metal, such as by etching. It should be understood that variations of the geometry and structures may be implemented by one of ordinary skill in the art based on the teachings herein without departing from the scope of the present invention.

Germanium Radiation Detectors

Aspects of the invention can be practiced in fabricating other forms of semiconductor radiation detectors. By way of example another class of radiation detector devices can be fabricated from Germanium (Ge).

By far the most common type of application for Ge detectors is basic gamma-ray spectroscopy, where a single detector is used with a single channel of electronics to provide energy information. With modern low-noise electronics and Ge materials, the best energy resolution achieved with Ge detectors at gamma-ray energies is close to the fundamental limits imposed by charge generation statistics. Therefore, further significant improvement in energy resolution is not expected, unless other non-ionization type detection techniques are used.

Figure 6:
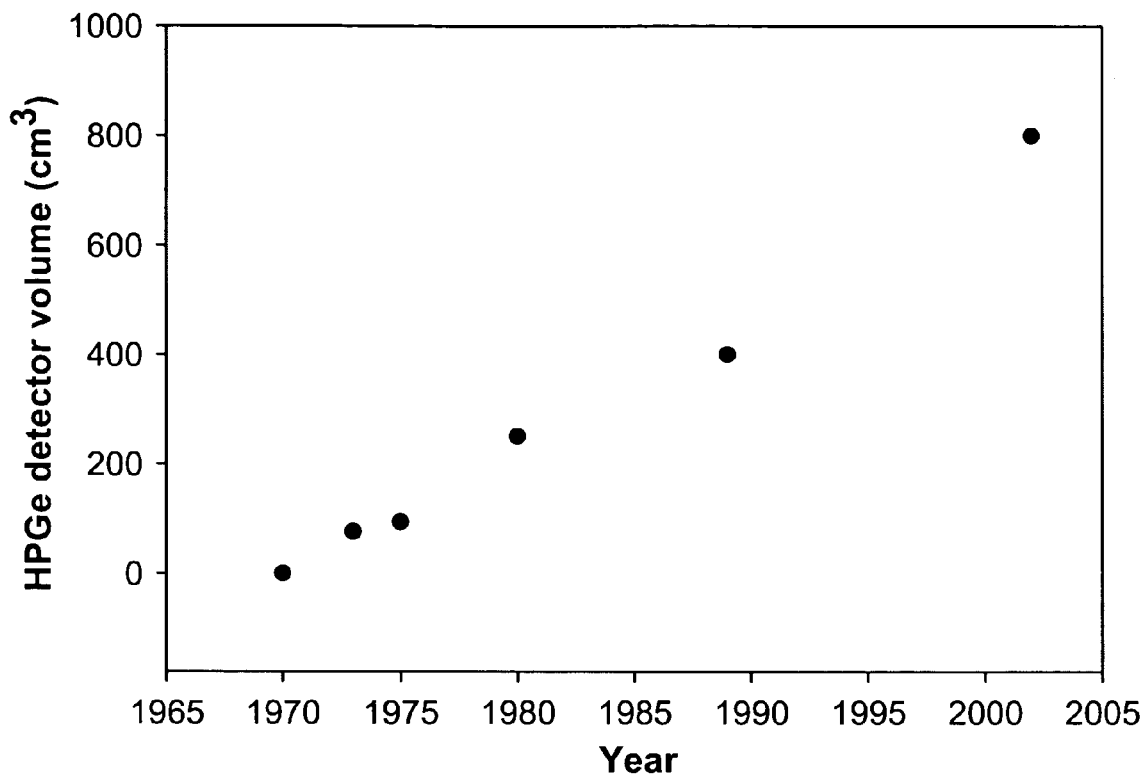
FIG. 6 is a plot of the historical increases in the maximum detection volume for high-purity Ge detectors over a period of years.

FIG. 6 illustrates the historical increase in the maximum detection volume of Ge detectors over time. The graph shows a steady volume increase over time. The data is compiled from published papers that are considered to provide information on the largest high-purity Ge detectors available. It is interesting to note that the detector size seems to increase roughly linearly with time. If this trend continues detectors with volumes approaching one liter should be available within a few years.

Besides increased detector volume, more complex detector structures have been developed to provide additional capabilities such as gamma-ray imaging. There are different methods to image gamma-rays, including the use of parallel-hole collimators, pinholes, coded apertures, and Compton cameras. Generally position-sensitive detectors are needed for implementing radiation imaging systems.

A common method to provide position sensitivity is to segment the contacts of a detector. Conventional contacts used in Ge detectors are Li diffused contacts (n-type) and B implanted contacts (p-type). The Li contacts are typically several hundred microns thick, making it difficult to segment using standard etching processes. Mechanical means such as cutting using diamond saws or ultrasonic machining can be utilized, although segmentation using a photolithography technique has also been developed. Whatever the segmentation methods employed, the relatively large thickness of the Li contact limits the minimum feature size of contact elements to greater than about one millimeter (1 mm). In addition, the diffusion of Li, which occurs even at room temperature, can lead to electrical shorts between contact elements when detectors are stored at room temperature for long periods of time, or when radiation damage annealing becomes necessary.

Another difficulty in making multi-segment detectors is the instability of the Ge surface. When contacts of a detector are segmented, the intrinsic Ge surface between the contact elements can often become unstable with time or with changes in ambient conditions, which may lead to increased leakage current, increased noise, or inadequate isolation between contact elements. Some type of surface passivation is desirable, but it must be able to be applied to the surface between contacts without affecting the ability to make electrical connections to each contact element.

In recent years, improved contact segmentation techniques have been developed, contributing to the increasing use of segmented Ge coaxial and planar detectors. The novel contact technology described herein simplifies the fabrication of multi-segment detectors, and can potentially increase the yield and reduce the cost of producing such detectors. These contacts make use of an amorphous-Ge (a-Ge) thin film over Ge (or other forms of amorphous semiconductor over a crystalline semiconductor) to create an electrically blocking junction between the amorphous-Ge and the bulk Ge crystal.

Figure 7:
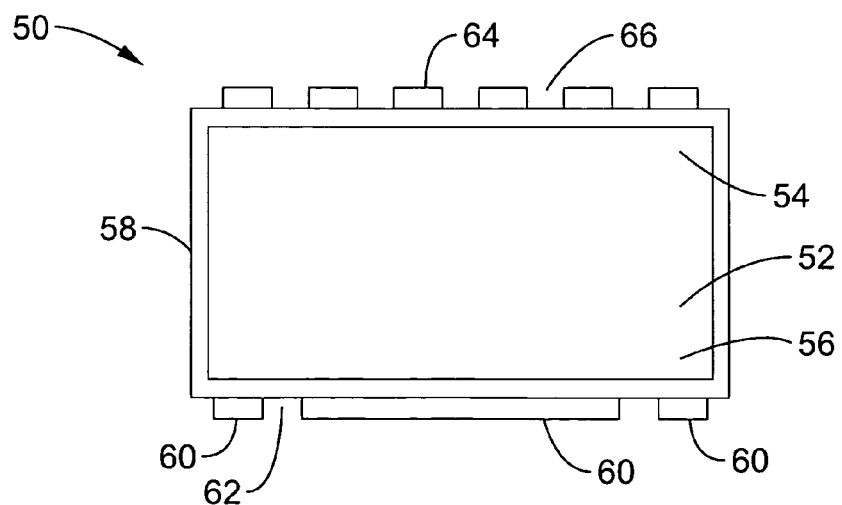
FIG. 7 is a cross-sectional view of a-Ge contact according to an aspect of the present invention.

FIG. 7 depicts a Ge multi-segment detector 50 with an a-Ge layer. A substrate 52 having upper portion 54 and lower portion 56, which can be doped as desired to form p and n regions. A layer of a-Ge 58 is formed over the exterior of substrate 52, upon which electrical contacts are formed, shown as a segmented contact 60 on the p side with gaps 62, and a segmented contact 64 on the n side with gaps 66.

The blocking junction permits the application of bias voltage to fully deplete the detector while maintaining a low leakage current. This embodiment can be formed in a fabrication process that includes the sputter deposition of an a-Ge layer onto the surface of the Ge crystal. Selected areas of the a-Ge film are then metallized to form the contact elements. The resistivity of the a-Ge film is sufficiently high to provide good electrical isolation between contact elements, while the small thickness of the film ensures that it does not affect the detector signals or the passage of signal currents to the metal contacts. An interesting property of the a-Ge contact is its ability to block carrier injection under either polarity of bias voltage.

Therefore the same process can be used on both sides of a detector to realize double-sided segmented detectors. One advantage of this contact technology is its simplicity, which involves very few processing steps and can be carried out entirely with the detectors at room temperature. Another advantage is that the a-Ge film covers the full surface of the Ge crystal, forming a passivation layer. There is no need for additional processes to passivate the surface between contact elements afterwards. The amorphous contacts are thin and stable with annealing up to 150° C. Very small scale contact structures, on the order of ~100 microns or less, can be realized.

In one embodiment the metal contacts on either side of the substrate, or wafer, are configured as strips wherein the p and n contacts are oriented orthogonally to one another. During testing of this embodiment a number of orthogonal-strip detectors have been successfully produced using the a-Ge contact technology. One of the detectors which was fabricated was a large 64×64 orthogonal strip Ge detector. Practical gamma-ray imaging systems using such detectors are being actively pursued with early imaging tests being carried out with prototype systems.

Experiments were performed wherein radiation from a radiation source was detecting using a Ge orthogonal-strip detector fabricated using a-Ge contacts. A pinhole collimator was used to form images of the sources onto the detector. By establishing energy windows at the corresponding gamma-ray lines, the sources can be separately imaged. Because of the excellent energy resolution of the Ge detector, narrow energy windows can be used, which provided a substantial reduction in background noise as well. In addition to the two-dimensional position information obtained from the orthogonal strips, the depth of gamma-ray interaction in the detector can also be determined by measuring the time difference between signals from strips on opposite sides of the detector. The ability to localize events within the detector in three dimensions improves the accuracy of reconstructed images.

Si Detectors

Si detectors were not normally considered for use in gamma-ray detection because of the low atomic number (Z) of Si and therefore low photopeak efficiency. However, in the specific case of gamma-ray imaging using Compton cameras, not only can Si be used, but it actually presents several advantages compared to Ge or other high-Z materials.

First of all, Compton scattering in Si is the predominant interaction versus photoelectric absorption down to the energy of 60 keV. This would allow Compton cameras to operate at lower energies than is possible with higher Z detectors. Also, the distance between gamma-ray interactions would be larger on average in Si, making it easier to reconstruct accurately the direction of incoming gamma-rays.

In addition, Doppler broadening is smaller in lower Z materials. Such a Doppler effect adds to the uncertainty in the reconstructed direction of incoming gamma-rays, thereby reducing the image resolution of a Compton camera.

Another important advantage of using silicon detectors is that they can be operated at much higher temperatures than Ge detectors, thus simplifying the cooling systems required to operate the detectors.

To achieve good detection efficiency in a Compton camera, silicon detectors can be used as the scatter layer, with a high Z detector layer as the absorber to fully capture the gamma-rays. An all-silicon Compton camera is also feasible using the "3-Compton" reconstruction method. This method relies on the fact that the measurement of only three Compton scatter events is sufficient to determine the energy and the direction (within a cone surface) of the incident gamma-ray photon. Therefore full absorption of the gamma-ray is not necessary, and good detection efficiency can be achieved even with low-Z materials such as Si.

Position information of gamma-ray interactions in a Si detector can be obtained using the orthogonal-strip configuration, described for the Ge detector. Detectors fabricated from high resistivity Si are already commercially available, however, their thickness are limited to a maximum of about two millimeters (~2 mm). It should be appreciated that for use in a Compton camera, the total thickness of Si required to achieve reasonable efficiency is typically on the order of several centimeters (cm). Thicker detectors are therefore desirable in order to reduce the number of detectors and readout channels. This can be realized using lithium-drifted Si (Si(Li)) detectors, which can be made up to approximately one centimeter (1 cm) thick.

Although Si(Li) detectors have been available for several decades, robust methods to fabricate orthogonal-strip contact structures have not been available. A contact technology is therefore described which is similar to that of the a-Ge contacts for Ge detectors, except that amorphous-Si (a-Si) is employed instead of a-Ge. The a-Si contact replaces the Li contact of the Si(Li) detector, but, unlike the case of the Ge detectors, it does not work well as a p-type contact. Therefore, B ion implantation is used to form the p-type contact. The B contact replaces the fragile Au surface barrier contact commonly used on Si(Li) detectors. The B contact has to be formed prior to Li drifting since the high-temperature annealing required to activate the B would destroy the Li compensation. Segmentation of the B contact by chemical etching is then carried out after Li drifting is completed.

One of the detectors fabricated according to the invention was a 20×20 orthogonal strip Si(Li) detector. Within this embodiment the detector had a thickness of 3.5 mm, a strip pitch of approximately 2 mm and a gap of about 0.5 mm between strips.

Figure 8A:
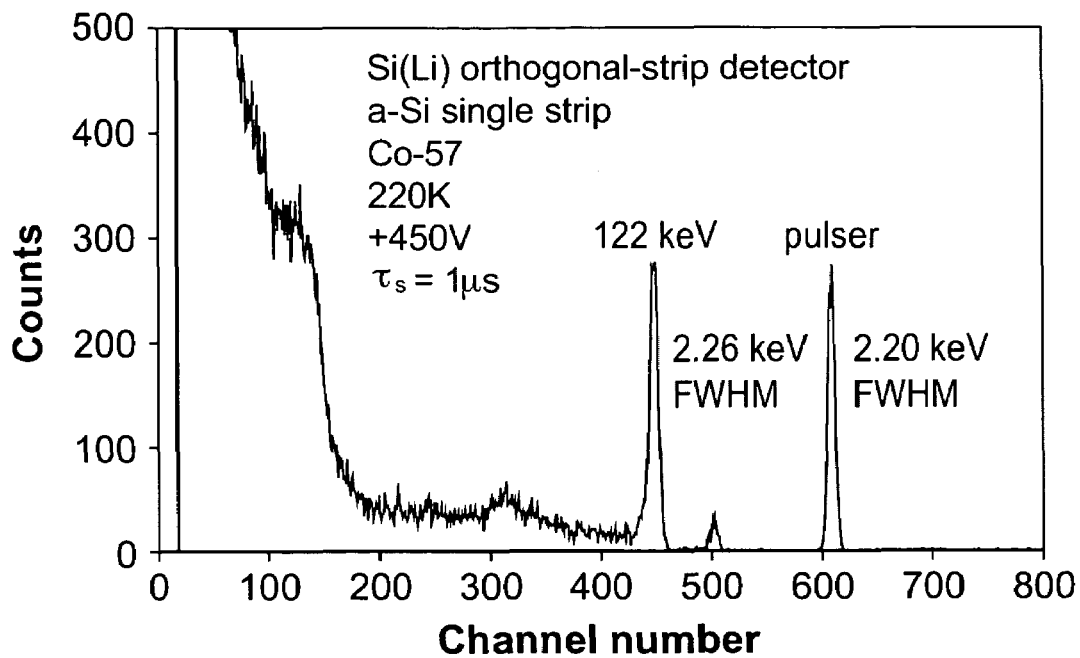
FIGS. 8A and 8B are plots of $^{57}$Co spectra obtained from an orthogonal strip detector.
Figure 8B:
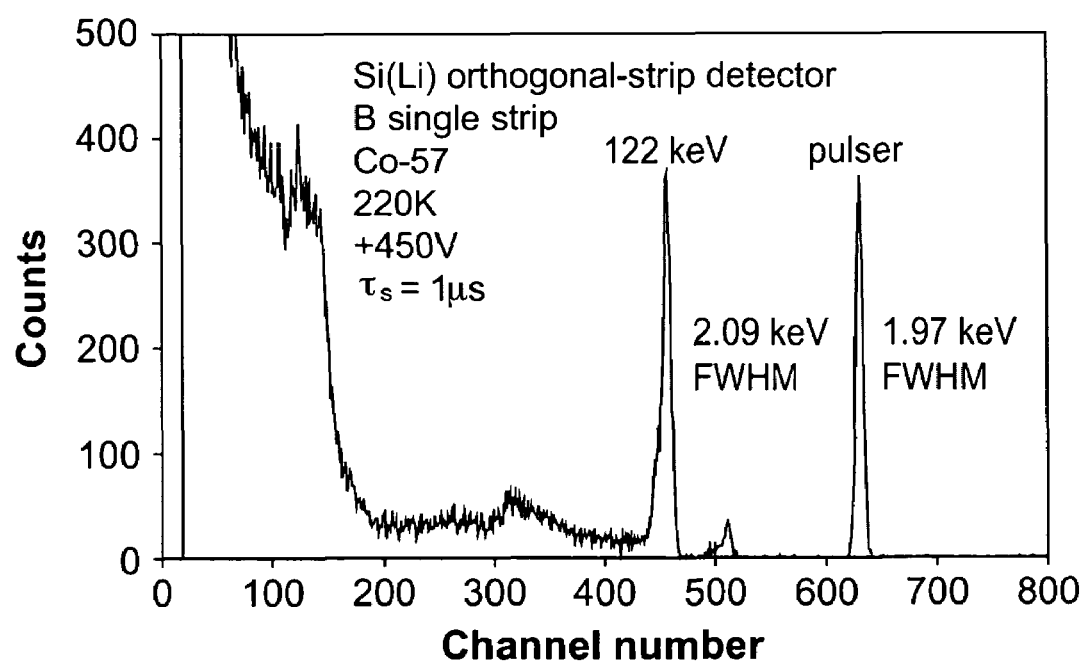

FIGS. 8A and 8B illustrate that good energy resolution (~2 keV FWHM) was obtained for the Si(Li) strip detector at operating temperatures of ~220 K, as shown by the $^{57}$Co spectra. Thicker detectors can be produced using the same process by utilizing longer times for Li drifting. Our work to employ these detectors in Compton cameras is ongoing.

CdZnTe Detectors

The use of CdZnTe crystals, which are high-Z wide bandgap semiconductors, as gamma-ray detectors started around 1991. The wide bandgap of CdZnTe allows detectors to operate at room temperature with low leakage currents. In addition, the average Z of CdZnTe is significantly higher than that of Ge, which could potentially yield higher photopeak efficiency. These features make CdZnTe extremely attractive as a gamma-ray detector material. Recently, significant progress has been made in growing large single-crystal CdZnTe for detector fabrication. However, present day CdZnTe, like other compound semiconductor detector materials, exhibits poor carrier transport properties. In particular, the hole mobility-lifetime product is very small, at ~5×10-5 cm$^2$/V. Electron transport is generally much better, at ~5×10$^{-3}$ cm$^2$/V, but it is still orders of magnitude worse than that of Ge.

As a consequence of limited carrier transport characteristics, conventional planar CdZnTe detectors typically provide poor spectral response. This result is caused by large variations in detector signals depending on the depth of gamma-ray interactions. In order for such detectors to achieve energy resolution close to that of Ge, the mobility-lifetime products for electrons and holes in CdZnTe would have to increased by several orders of magnitude. It seems highly unlikely that such large improvements can be achieved in the foreseeable future.

Fortunately, alternate techniques have been developed to circumvent some of these material deficiencies. A significant development was the use of "electron only" charge sensing devices. These devices make use of special detector electrode geometries to improve detector response. One method makes use of the "small pixel effect", which includes detectors with pixilated anodes or hemispherical geometry. Improved spectral response is achieved because the charge induction property of the detector is modified by the electrode configuration such that events generating charge at different depths in the detector produce signals with less variation compared to simple planar detectors. Best results are obtained by optimizing the electrode geometry in accordance with the carrier transport properties of the material. In most cases, however, the ultimate performance achievable using such devices is fundamentally limited. Further improvements can be achieved by employing electronic correction techniques in conjunction with pixel detectors. Although very good energy resolution can be obtained with these techniques, the complexity of the electronics, both to readout individual pixels of a detector and to perform the correction, is considerable.

Figure 9:
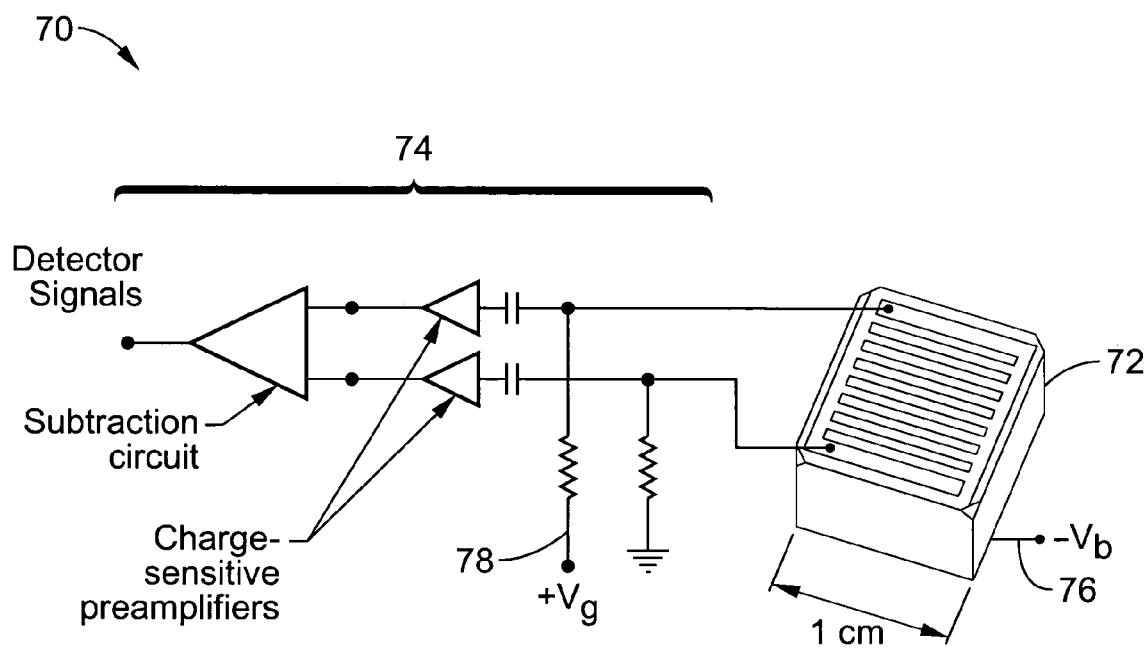
FIG. 9 is a schematic of a coplanar-grid gamma-ray detector according to an embodiment of the present invention, shown coupled to front-end electronics for signal detection.

FIG. 9 depicts a "coplanar-grid" embodiment 70 utilizing a detector 72 having two interdigital coplanar grid electrodes to sense the motion of charge carriers in the detector. In this embodiment, detector 72 is a coplanar-grid CdZnTe detector. A readout circuit 74 is shown comprising conditioning circuitry depicted as an AC coupling input to a pair of charge-sensitive preamplifiers. The amplified signal from the preamps is input to a differential circuit, in this case a subtractor. During operation, a high voltage bias 76 (-V$_b$) is applied to the cathode to sweep carriers across the detector, and a small voltage (V$_g$) is applied between the two grids to direct the electrons towards one of the grids (collecting grid) and away from the other (non-collecting grid).

The signals induced on these two grids by the movement of carriers are subtracted to give a net output signal. This signal can then be processed the same way as that of a conventional detector to perform spectroscopy. This differential signal measurement produces a detector signal that is predominantly determined by the number of electrons reaching the collecting grid. The problem of poor hole collection is then largely eliminated by utilizing this mechanism. In addition, by adjusting the relative gain of the two grid signals before subtraction, the effects of electron trapping can be nearly perfectly compensated for. The net result is that the detector signals become independent of the depths of gamma-ray interactions over much of the detector volume, and therefore excellent energy resolution can be obtained.

Figure 10A:
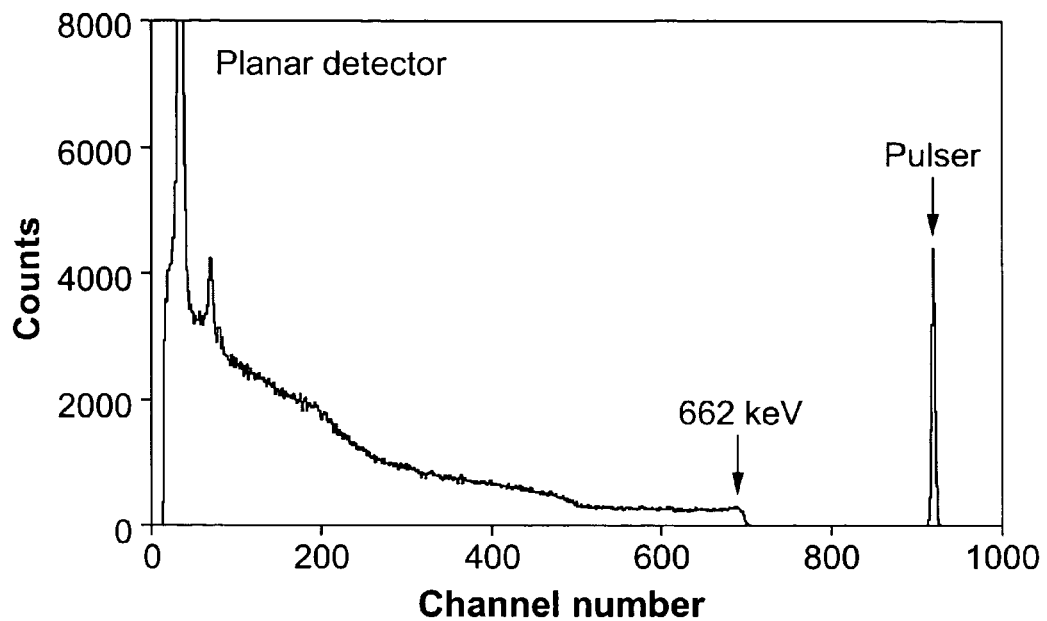
FIGS. 10A and 10B are plots of $^{137}$Cs spectrum obtained with a one cubic centimeter (1 cm$^3$) CdZnTe detector according to an embodiment of the present invention, showing a conventional planar geometry (FIG. 10A) and a coplanar-grid geometry (FIG. 10B).
Figure 10B:
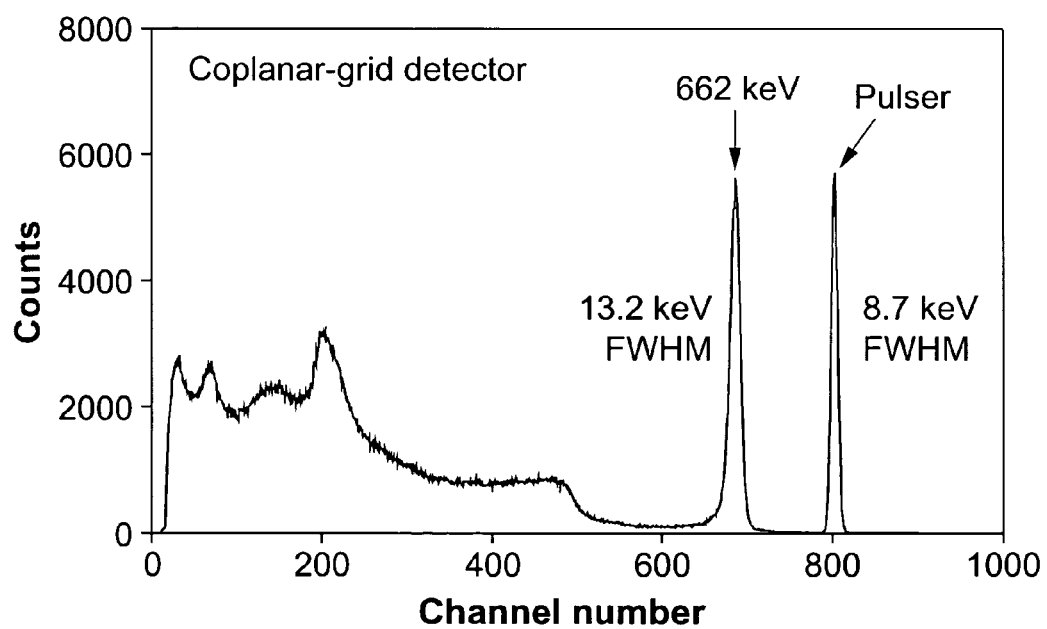

FIGS. 10A and 10B show very substantial spectral response improvements being achieved using the coplanar-grid technique for a one cubic centimeter (1 cm$^3$) CdZnTe detector. Although the energy resolution is still significantly worse than Ge, it is several times better than that of scintillation detectors. With the coplanar-grid technique, it is theoretically possible to achieve resolution close to that of Ge detectors given the typical carrier lifetime already achieved with present CdZnTe materials. The two main factors that are now limiting the energy resolution are material non-uniformity and electronic noise. Progress is being made toward enhancing these areas and improving detector performance.

One embodiment of the system which was tested was a portable detection system using a portable general purpose computer coupled to a radiation detector according to the invention. The specific implementation comprises a one cubic centimeter (1 cm$^3$) coplanar-grid CdZnTe detector assembled with a commercial MCA. It should be recognized that the ability of CdZnTe detectors to operate at room temperature and the simplicity of electronics required to implement the coplanar-grid technique make it possible to build highly compact detection systems. A more compact system, containing a two cubic centimeter (2 cm$^3$) detector, is currently being developed. Despite the relatively small volume of these detectors at the present time, the detection efficiency is quite good due to the high-Z of CdZnTe.

Figure 11A:
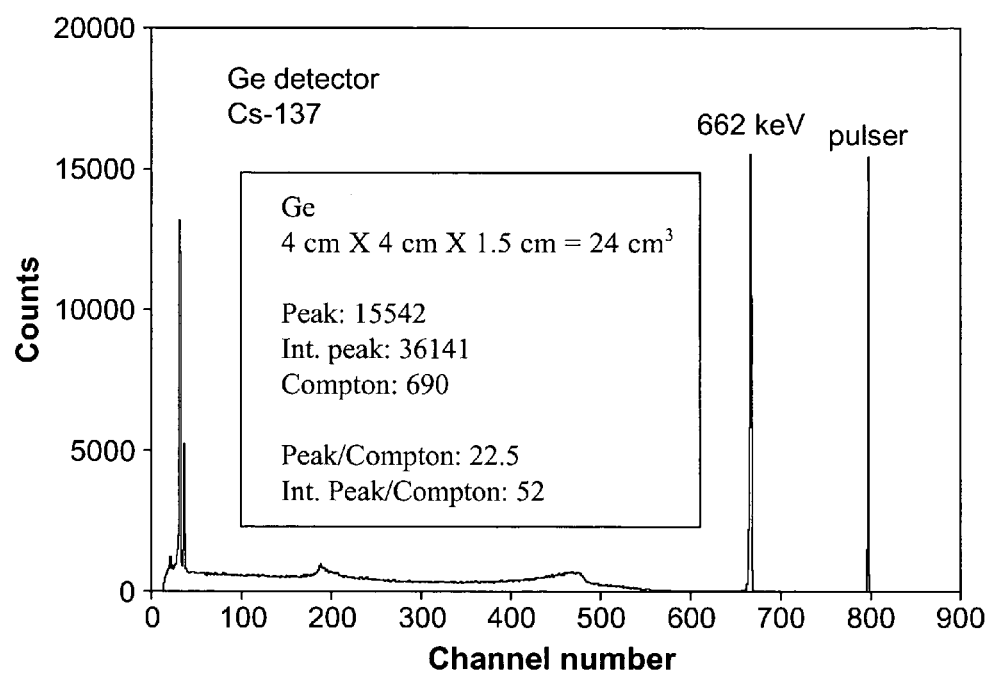
FIGS. 11A and 11B are plots of $^{137}$Cs spectra according to an embodiment of the present invention, shown obtained from a 24 cm$^3$ Ge planar detector (FIG. 11A) and a 1 cm$^3$ CdZnTe coplanar-grid detector (FIG. 11B).
Figure 11B:
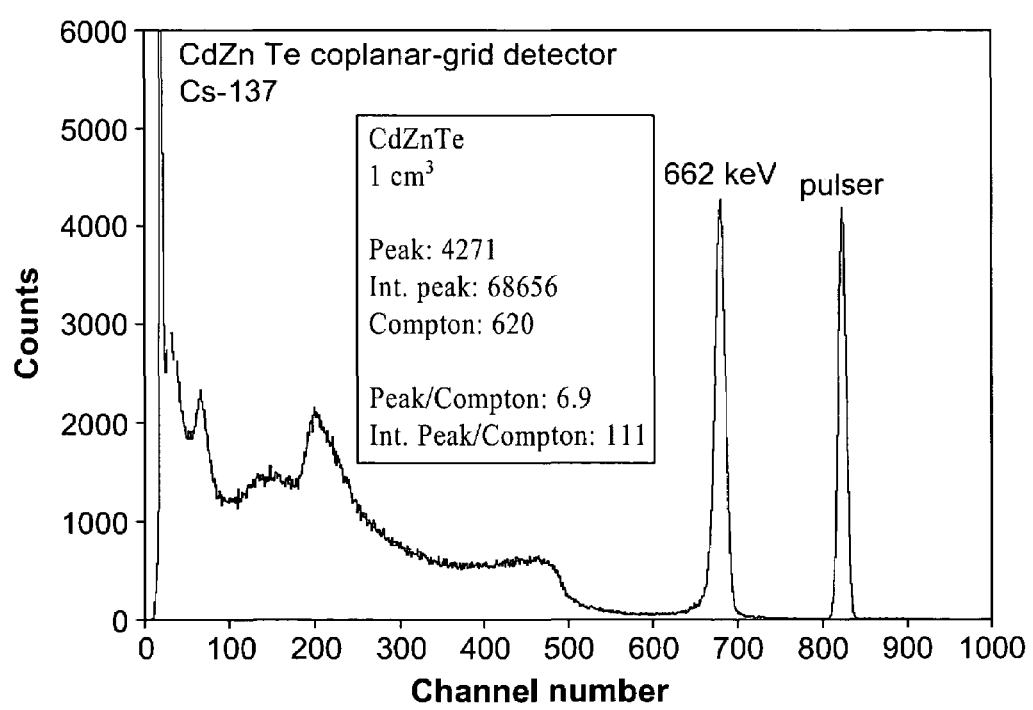

FIG. 11A and FIG. 11B illustrate a comparison of $^{137}$Cs spectra obtained from a 24 cm$^3$ Ge detector (FIG. 11A) and a one cubic centimeter (1 cm$^3$) CdZnTe coplanar-grid detector (FIG. 11B). The spectra were taken with different source-to-detector distances so absolute efficiency comparison cannot be made, but valid comparisons can be made using peak-to-Compton ratios. The Ge detector has a higher peak-to-Compton ratio as normally defined, but this is mainly due to its better energy resolution. If the integrated photopeak counts are used to compute an "integrated photopeak"-to-Compton ratio, the CdZnTe detector is actually a factor of two better than the Ge detector. In other words, the CdZnTe detector is twice as efficient in capturing the full energy of the gamma-rays than the Ge detector, even though the Ge detector has 1.5 times the thickness and 24-times the volume.

CONCLUSIONS

The present teachings continue to advance the technology of semiconductor gamma-ray detectors, although the development work has been performed in the area of semiconductor radiation detectors (i.e. Ge) for over forty years. The recent development of large segmented Ge and Si detectors, as taught herein, makes possible the creation of high performance imaging systems. A method of forming contacts on lithium-drifted silicon detectors, contact segmentation, and surface treatment for improved passivation, has been presented. The method, and the device produced by the method, allows for improved room-temperature radiation detection.

The combination of imaging and high-resolution spectroscopy afforded by these detectors provides a powerful new capability for the detection of gamma-ray sources. In the area of room-temperature detectors, the availability of high quality CdZnTe materials coupled with the development of novel charge sensing techniques has made it possible to produce highly compact detection systems with good energy resolution and efficiency.

All publications, patents, and patent applications mentioned in this specification are herein incorporated by reference to the same extent as if each individual publication or patent application were each specifically and individually indicated to be incorporated by reference.

The description given here, and best modes of operation of the invention, are not intended to limit the scope of the invention. Many modifications, alternative constructions, and equivalents may be employed without departing from the scope and spirit of the invention.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method for fabricating a segmented lithium-drifted detector, comprising:
   providing a p-type silicon substrate having a top and bottom surface;
   forming a doped p-type layer on said bottom surface;
   forming a lithium diffused layer on said top surface;
   compensating said p-type silicon substrate by applying simultaneous heat, and electrical field from said top surface to said bottom surface, for a sufficient period of time to compensate the p-type impurity in the substrate to a desired atomic concentration;
   removing the lithium diffused layer from said top surface;
   depositing an amorphous semiconductor layer on said top surface; and
   depositing a conductive layer over said amorphous semiconductor layer.

2. A method as recited in claim 1, wherein said desired atomic concentration is less than or equal to 10$^{10}$/cm$^3$ within said substrate.

3. A method as recited in claim 1, wherein said doped p-type layer is formed by:
   ion implantation of one or more elements that act as acceptors in silicon, primarily from the group III elements consisting of B, Al, Ga, In, and Tl, and
   moderate temperature annealing.

4. A method as recited in claim 1, wherein the removing step is mechanical grinding or chemical etching.

5. A method as recited in claim 1, wherein said moderate temperature annealing occurs at a temperature less than or equal to 550° C.

6. A method as recited in claim 1, further comprising:
   patterning a top conductive layer deposited above said amorphous semiconductor layer on said top surface into a top pattern; and
   patterning a p-type contact on said bottom surface into a bottom pattern.

7. A method as recited in claim 6, wherein each said patterning step comprises either deposition through a shadow mask, or the use of positive or negative photoresist photolithography.

* * * * *